(12) United States Patent
Chen et al.

(10) Patent No.: US 8,716,778 B2
(45) Date of Patent: May 6, 2014

(54) METAL-INSULATOR-METAL CAPACITORS

(75) Inventors: Shuxian Chen, Fremont, CA (US);
Jeffrey T. Watt, Palo Alto, CA (US);
Mojy Curtis Chian, Laguna Niguel, CA (US)

(73) Assignee: Altera Corporation, San Jose, CA (US)

( * ) Notice: Subject to any disclaimer, the term of this patent is extended or adjusted under 35 U.S.C. 154(b) by 538 days.

(21) Appl. No.: 12/272,671

(22) Filed: Nov. 17, 2008

(65) Prior Publication Data
US 2010/0123213 A1 May 20, 2010

(51) Int. Cl.
*H01L 27/108* (2006.01)
*H01L 29/76* (2006.01)
*H01L 29/94* (2006.01)
*H01L 31/119* (2006.01)

(52) U.S. Cl.
USPC .... 257/303; 257/307; 257/532; 257/E27.086; 257/E27.087; 257/E27.088

(58) Field of Classification Search
USPC .......... 257/532, 534, E27.048, E21.109, 303, 257/304, 306, 307, E27.086, E27.087, 257/E27.088; 438/253, 393, 396; 361/301.1–330
See application file for complete search history.

(56) References Cited

U.S. PATENT DOCUMENTS

| | | | | |
|---|---|---|---|---|
| 5,172,299 | A * | 12/1992 | Yamada et al. | 361/321.2 |
| 5,583,359 | A | 12/1996 | Ng et al. | |
| 6,266,227 | B1 * | 7/2001 | Konushi et al. | 361/306.1 |
| 6,385,033 | B1 * | 5/2002 | Javanifard et al. | 361/306.2 |
| 6,496,021 | B2 * | 12/2002 | Tartagni et al. | 324/687 |
| 6,524,926 | B1 | 2/2003 | Allman et al. | |
| 6,661,638 | B2 * | 12/2003 | Jackson et al. | 361/303 |
| 6,743,671 | B2 * | 6/2004 | Hu et al. | 438/253 |
| 6,864,704 | B1 * | 3/2005 | Wong et al. | 326/26 |
| 6,969,680 | B2 * | 11/2005 | Paul et al. | 438/669 |
| 6,980,414 | B1 * | 12/2005 | Sutardja | 361/306.3 |
| 7,126,809 | B2 | 10/2006 | Iioka et al. | |
| 7,327,011 | B2 * | 2/2008 | Hudson et al. | 257/534 |
| 7,456,462 | B1 * | 11/2008 | Heshami et al. | 257/307 |
| 2005/0017321 | A1 * | 1/2005 | Hakkarainen et al. | 257/532 |
| 2005/0135042 | A1 * | 6/2005 | Fong et al. | 361/303 |

(Continued)

FOREIGN PATENT DOCUMENTS

| | | |
|---|---|---|
| CN | 1411610 | 4/2003 |
| CN | 101043034 | 9/2007 |
| DE | 100 46 910 | 5/2001 |

OTHER PUBLICATIONS

Aparicio, Robert and Hajimiri, Ali. "Capacity Limits and Matching Properties of Integrated Capacitors." IEEE Journal of Solid-State Circuits, vol. 37, No. 3, p. 384-393, Mar. 2002.

*Primary Examiner* — Hoai V Pham
(74) *Attorney, Agent, or Firm* — Treyz Law Group; David C. Kellogg

(57) ABSTRACT

Metal-insulator-metal capacitors are provided that are formed in integrated circuit dielectric stacks. A line-plate-line capacitor is provided that alternates layers that contain metal plates with layers that contain straight or angled parallel lines of alternating polarity. A segmented-plate capacitor is provided that has metal plates that alternate in polarity both within a layer and between layers. The line-plate-line and segmented-plate capacitors may exhibit a reduced parasitic inductive coupling. The capacitances of the line-plate-line capacitor and the metal-insulator-metal capacitor may have an enhanced contribution from an interlayer capacitance component with a vertical electric field than a horizontal intralayer capacitance component with a horizontal electric field.

12 Claims, 15 Drawing Sheets

(56) References Cited

U.S. PATENT DOCUMENTS

| | | |
|---|---|---|
| 2006/0086965 A1 | 4/2006 | Sakaguchi et al. |
| 2007/0096252 A1* | 5/2007 | Hudson et al. ........... 257/532 |
| 2007/0158717 A1 | 7/2007 | Edelstein et al. |
| 2007/0187739 A1 | 8/2007 | Liu et al. |
| 2008/0099880 A1 | 5/2008 | Cho et al. |
| 2008/0130200 A1 | 6/2008 | Edelstein et al. |
| 2008/0274612 A1* | 11/2008 | Paul et al. ................ 438/666 |

* cited by examiner

METAL-INSULATOR-METAL CAPACITORS

BACKGROUND

This invention relates to integrated circuit capacitors, and more particularly, to metal-insulator-metal capacitors that are formed in the dielectric stack of an integrated circuit.

The dielectric stack of an integrated circuit commonly contains alternating metal interconnect layers and "via" layers that together provide electrical connection to devices on the semiconductor substrate. Capacitors in the dielectric stack can be formed from the same metal and dielectric materials that are used in forming the interconnects. Forming capacitors in the dielectric stack conserves valuable integrated circuit surface area, as capacitors can be formed directly over semiconductor devices in the substrate.

Capacitors in the dielectric stack can be constructed across multiple metal interconnect layers, and can have geometries that utilize both vertical (interlayer) and horizontal (intralayer) electric field components. For example, metal-comb-woven capacitors may be implemented in metal interconnect layers as a series of metal lines that alternate in voltage both horizontally (within a layer) and vertically (between layers). Such capacitors have electric field lines with both horizontal and vertical components. Metal-comb-woven capacitors can also be implemented so that metal lines in one metal interconnect layer are oriented at right angles to metal lines in adjacent metal interconnect layers. This type of arrangement exhibits reduced interlayer capacitance but is less susceptible to parasitic inductive coupling effects.

The precise geometry that would be optimal to use for capacitors on a given integrated circuit is sensitive to the parameters and capabilities of the current semiconductor technology. For example, as technology advances to enable the formation of smaller devices, and as dielectric materials with lower dielectric constants are used, it might be desirable to use capacitor geometries that take advantage of these changes. It would be desirable to use a capacitor geometry that exhibits a satisfactory capacitance per unit of surface area and limited parasitic inductive coupling effects.

SUMMARY

In accordance with the present invention, metal-insulator-metal capacitors are provided that may be implemented in metal interconnect layers in an integrated circuit dielectric stack.

As integrated circuit technology scales to smaller sizes, and as dielectric materials with smaller dielectric constants are used in the dielectric stack, capacitor designs that emphasize a vertical (interlayer) capacitance over a horizontal (intralayer) capacitance may help maximize capacitance per surface area.

A line-plate-line capacitor design may be provided that contains metal lines and metal plates in alternating metal interconnect layers. The metal lines within a metal interconnect layer may be arranged in parallel and with alternating polarity. Metal lines with the same polarity may be shorted together to form a comb-like structure. The metal plates may be arranged in a grid pattern with similar or alternating polarities.

A segmented-plate capacitor design may also be provided that contains metal plates that alternate in polarity both within a metal interconnect layer and between metal interconnect layers (in the vertical direction). The metal plates may be arranged in a checkerboard pattern of alternating polarities within a given metal interconnect layer.

The line-plate-line and segmented-plate capacitors have geometries that may help emphasize creation of vertical (interlayer) capacitance relative to lateral (intralayer) capacitance. The metal plates in these capacitors may also exhibit reduced parasitic inductive coupling effects compared to capacitors formed entirely from metal lines.

Further features of the invention, its nature, and various advantages will be more apparent from the accompanying drawings and the following detailed description.

DETAILED DESCRIPTION

The present invention relates to integrated circuit capacitors that may be formed across multiple metal interconnect layers in a dielectric stack. The capacitors contain metal plates in order to emphasize a vertical (interlayer) capacitance contribution. The metal plates may exhibit a plate-shielding effect that tends to reduce parasitic inductive coupling.

Figure 1:
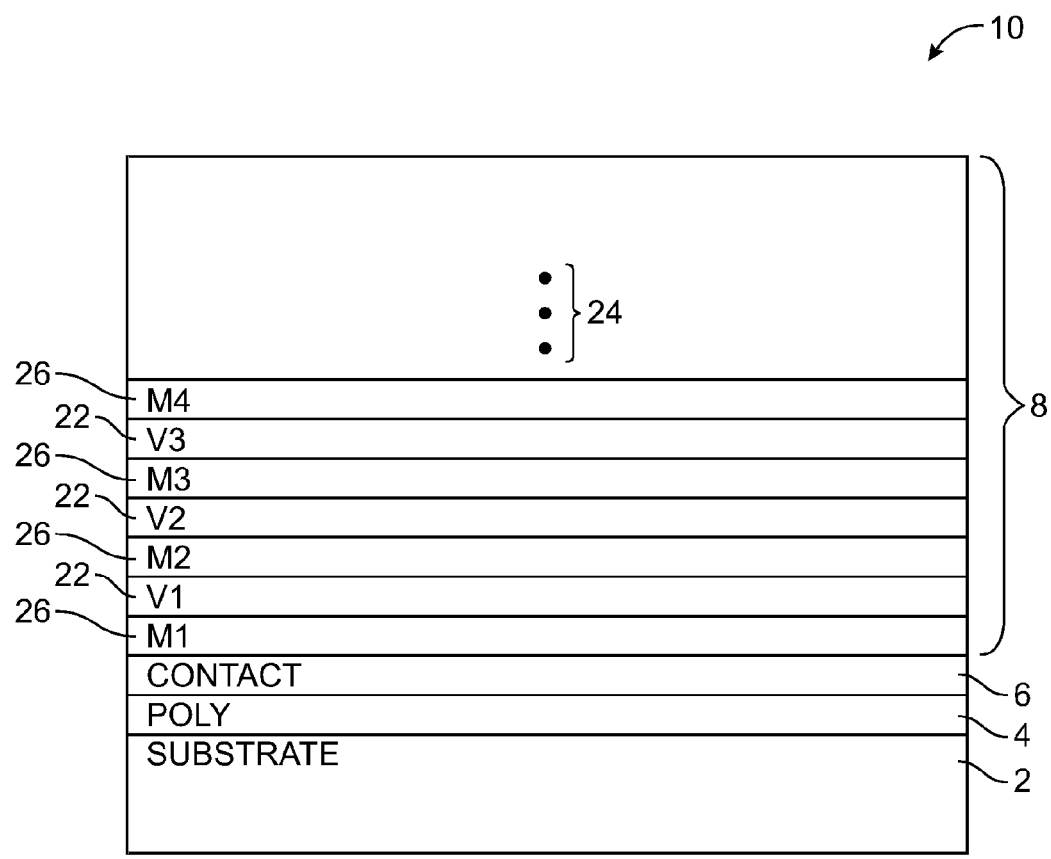
FIG. 1 is a cross-section of an integrated circuit showing a dielectric stack with metal interconnect layers and via interconnect layers in accordance with an embodiment of the present invention.

A cross-sectional view of an integrated circuit 10 is shown in FIG. 1. Integrated circuit 10 has semiconductor substrate 2. Substrate 2 may be formed from silicon or other suitable semiconductor material. Portions of semiconductor substrate 2 can be doped to form structures such as source and drain regions for transistors. Above semiconductor substrate 2 is a layer 4 such as a polysilicon layer that can be patterned to form transistor gates and other structures. Contact layer 6 may contain short vertical conductors made from a conductive material such as tungsten. The short vertical conductors can be used to connect patterned polysilicon in polysilicon layer 4 to patterned metal in the first (M1) metal interconnect layer of dielectric stack 8. If desired, other configurations may be used for the first few layers of an integrated circuit. The arrangement of FIG. 1 is merely illustrative.

Dielectric stack 8 may be composed of alternating metal interconnect layers 26 and via interconnect layers 22. In the example of FIG. 1, metal interconnect layers 26 have been labeled "M1, M2 . . . " beginning from the metal interconnect layer closest to the semiconductor substrate. Via interconnect layers 22 have been labeled "V1, V2 . . . " starting from the via interconnect layer closest to the semiconductor substrate. Additional metal interconnect layers and via interconnect layers may be formed if desired, as indicated by dots 24. In a typical arrangement, there may be seven or more metal interconnect layers 26 and six or more via interconnect layers 22.

During fabrication, metal interconnect layers 26 are patterned to form conductive routing paths, which are sometimes called interconnects. The interconnects can be formed from copper, aluminum or other suitable conductive materials. These paths are typically less that a micron in width and are used to connect devices on the integrated circuit so that they perform desired circuit functions. Via interconnect layers 22 are generally used to form short column-shaped vertical conductors called vias. The vias on an integrated circuit are used to connect interconnects in adjacent metal interconnect layers. As an example, a via in via layer V2 may be used to connect a metal interconnect line in metal layer M3 to a corresponding metal interconnect line in metal layer M2.

Dielectric material fills the space between interconnect paths in the metal interconnect layers and the space between vias in the via interconnect layers. The dielectric material may be formed from silicon oxide, carbonated silicon oxide, or other suitable insulating material that has been fabricated with a low dielectric constant. The dielectric material may be porous or may utilize air gaps to help reduce its dielectric constant. Dielectric material with a low dielectric constant is often desirable in order to decrease electromagnetic cross-coupling between signals on various interconnects.

Capacitors that are formed in dielectric stack 8 are often formed in metal interconnect layers M2 and above. Capacitors may be formed using the lowermost M1 metal interconnect layer, but this type of arrangement is typically not preferred, as it may lead to interference with devices located in the semiconductor substrate. Capacitors that are formed in dielectric stack 8 can utilize the same conductive and dielectric materials that are used to form the interconnects in stack 8.

The formation of capacitors in a dielectric stack such as a dielectric stack with dielectric material with a low dielectric constant presents challenges. For example, decreasing the dielectric constant of the dielectric to improve the performance of the interconnects in stack 8 will tend to decrease the capacitance of a capacitor with a given structure. This is because capacitance scales with the magnitude of the dielectric constant.

Figure 2:
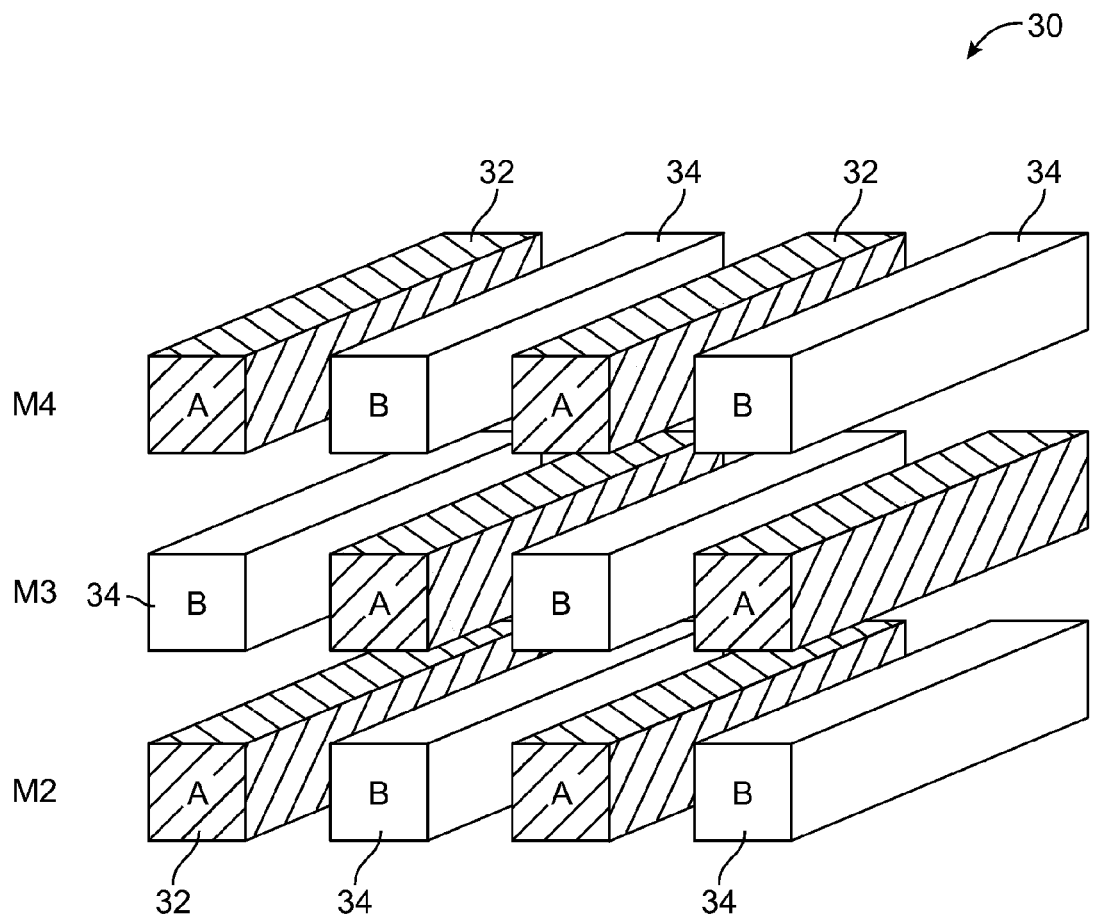
FIG. 2 is a perspective view of a conventional metal-comb-woven capacitor containing parallel metal lines that are oriented in a single direction.

FIG. 2 shows a conventional metal-comb-woven capacitor 30 that has been formed in a dielectric stack. Metal-comb-woven capacitor 30 has been formed from parallel metal lines in multiple metal interconnect layers. In the example of FIG. 2, metal-comb-woven capacitor 30 has been formed across three sequential metal interconnect layers M2, M3, and M4, although metal-comb-woven capacitor 30 are sometimes formed across other numbers of metal interconnect layers and are sometimes also be formed in higher metal interconnect layers of a dielectric stack.

Metal-comb-woven capacitor 30 has metal lines 32 of polarity A and metal lines 34 of polarity B. Metal lines 32 are shorted together to form a first terminal of capacitor 30, while metal lines 34 are shorted together to form a second terminal of capacitor 30. Metal lines of a common polarity in each metal interconnect layer can be connected in such a way as to form comb-like structures in which the parallel metal lines form a "toothed" portion of the comb-like structure. The connection structure may also wrap around to one side of the metal lines (e.g., forming the "handle" portion of the comb-like structure), facilitating connection between adjacent metal interconnect layers and their respective comb-like metal line structures (e.g., adjacent comb-like metal line structures may be connected by multiple via interconnects). The comb-like structures of each polarity can be "woven" such that metal lines 32 and 34 are arranged with alternating polarity, as shown in FIG. 2. The polarity of the metal lines can be offset in adjacent metal interconnect layers such that the polarity of metal lines also alternates in the vertical (interlayer) direction, as shown in FIG. 2.

The alternating metal lines within a metal interconnect layer contribute to a horizontal (intralayer) capacitance, while the alternating metal lines in the vertical direction contribute to a vertical (interlayer) capacitance. As a result of these two capacitance contributions, the capacitance exhibited by conventional capacitors of the type shown in FIG. 2 can be fairly high, particularly in conventional dielectric stacks having dielectrics with conventional dielectric constants. However, the parallel metal lines of capacitor 30 can make it susceptible to the effects of parasitic inductive coupling which may result in an undesirable variation in capacitance as a function of operating frequency.

Figure 3:
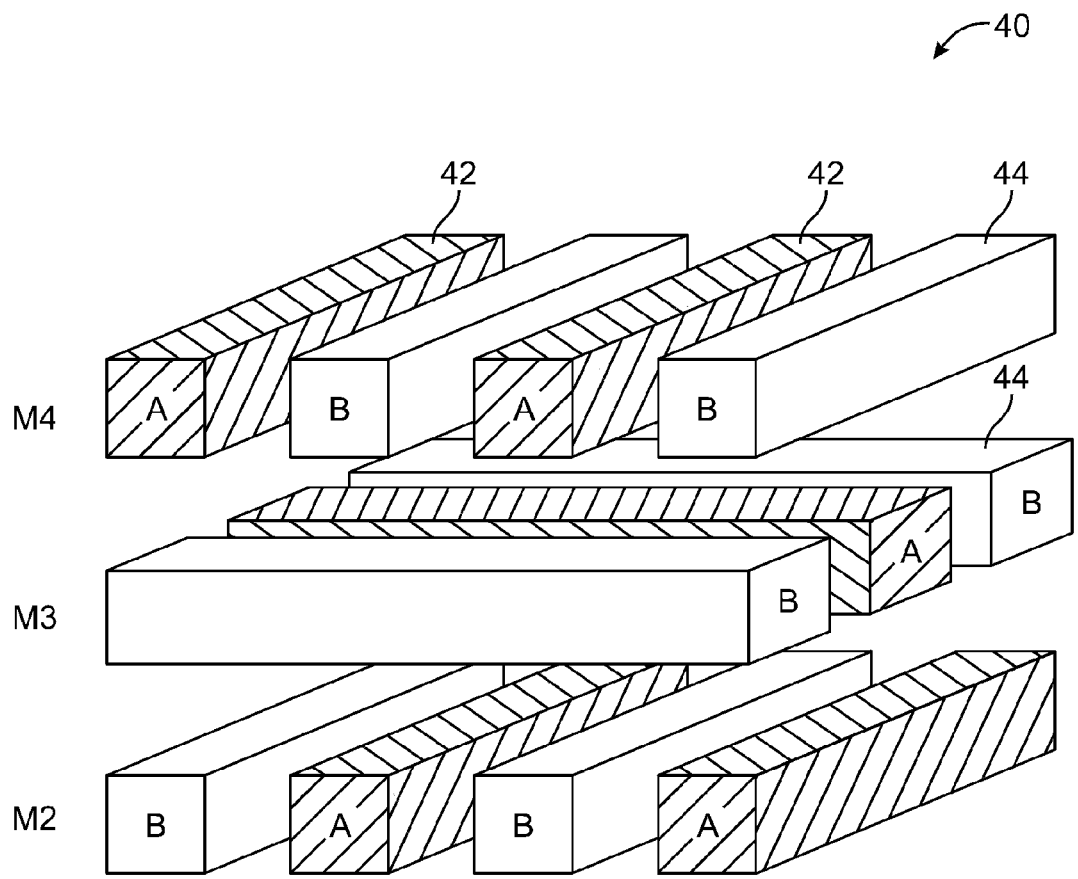
FIG. 3 is a perspective view of a conventional metal-comb-woven capacitor contain parallel metal lines that are oriented orthogonally in alternating metal interconnect layers.

Metal-comb-woven capacitors can also take on the configuration shown in FIG. 3. The conventional metal-comb-woven capacitor 40 of FIG. 3 also has parallel metal lines 42 of polarity A and parallel metal lines 44 of polarity B. Metal lines 42 of each metal interconnect layer may be shorted together to form a comb-like capacitor terminal of polarity A and metal lines 44 of each metal interconnect layer 44 may be shorted together to form a comb-like capacitor of polarity B.

In contrast to capacitor 30 of FIG. 3, the metal lines in the M3 metal interconnect layer of capacitor 40 are oriented orthogonally with respect to the metal lines in the M2 and M4 metal interconnect layers.

The alternating metal lines within a metal interconnect layer contribute to a horizontal (intralayer) capacitance. However, capacitor 40 has a reduced vertical (interlayer) capacitance as compared to capacitor 30 in FIG. 2. The primary contribution to vertical interlayer capacitance in capacitor 40 arises from the relatively small overlap area associated with intersections where a metal line of one polarity overlaps with a metal line of the opposite polarity in an adjacent metal interconnect layer. Horizontal intralayer capacitance therefore plays a predominant role in the total capacitance of capacitor 40. Capacitor 40 has a reduced susceptibility to parasitic inductive coupling as compared to capacitor 30 as each metal line has fewer metal line neighbors that are oriented in the same direction.

Figure 4:
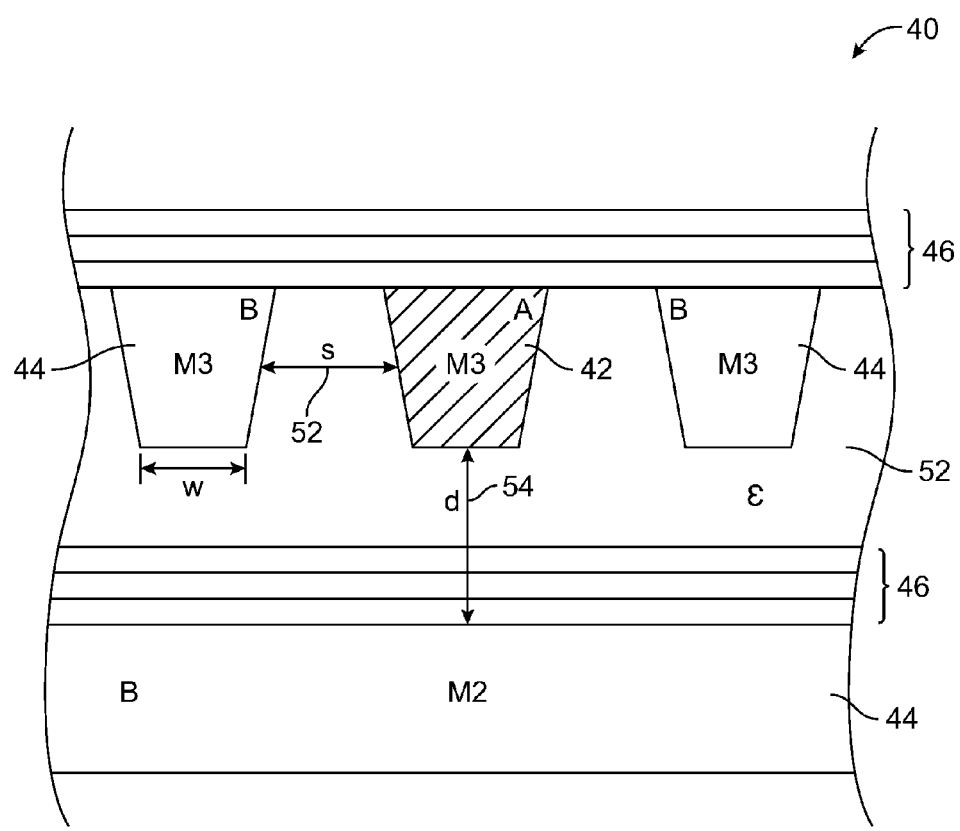
FIG. 4 is a cross-sectional view of a metal-comb-woven capacitor with metal lines oriented in orthogonal directions in alternating metal interconnect layers.

FIG. 4 shows a cross-sectional view of a metal-comb-woven capacitor 40. Metal lines 44 with polarity B and metal lines 42 of polarity A are shown in metal interconnect layer M3 and a metal line 42 with polarity B is shown in metal interconnect layer M2 oriented transverse to the metal lines in M3 metal interconnect layer. A number of caps and etch-stops, referred to collectively as caps 46, may be located immediately above each metal interconnect layer. Caps 46 include layers of materials that seal conductive metal inside metal lines 42 and 44 and thereby prevent conductive material from diffusing into dielectric material 52. Caps 46 may also include etch-stops for use during processing. Caps 46 are shown in FIG. 4 as containing three material layers, but caps 46, may, in general, include any suitable number of material layers (e.g. diffusion barriers, adhesion layers, etch stops, etc).

A vertical (interlayer) capacitance of capacitor 40 is represented by arrow 54, and a horizontal (intralayer) capacitance, represented by arrow 52. For a simple parallel-plate capacitor, capacitance is inversely proportional to the distance between the plates and directly proportional to the dielectric constant $\in$ of the dielectric material that fills the space between the plates. The horizontal intralayer capacitance can be expected to increase as line-spacing s is decreased and the vertical interlayer capacitance can be expected to increase as interlayer spacing d between the metal interconnect layers is decreased. It is possible for both line-spacing s and interlayer spacing d to be decreased in size as semiconductor processing technology advances. The minimum possible line-width w of a metal line is also expected to decrease as semiconductor technology advances, increasing the potential density of metal lines per unit area, and thereby increasing capacitance for dielectric stack capacitors. On the other hand, the use of dielectric materials 52 with lower dielectric constants $\in$ in order to reduce cross-coupling between interconnects tends to cause both intralayer and interlayer capacitance to decrease.

However, the effective dielectric constant for the vertical direction is related not only to the dielectric constant $\in$ of dielectric material 52, but also to the inherent dielectric properties of caps 46, which may be large compared to dielectric constant $\in$. For example, for an integrated circuit in the 32 nm technology node, dielectric material 52 may have a dielectric constant $\in$ of 2.5 $\in_0$, whereas caps 46 may have dielectric constants ranging from 2.7 $\in_0$ to 4.5 $\in_0$. As dielectric constant $\in$ is reduced, the vertical interlayer capacitance may therefore scale down less aggressively than the horizontal intralayer capacitance. This can be exploited using a capacitor design that takes advantage of the greater effective dielectric constant in the vertical interlayer direction as provided by the inherent dielectric properties of caps 46. Capacitor structures can also be produced that exhibit low levels of inductive coupling and that exhibit satisfactory levels of capacitance even in configurations in which larger-than-minimum spacings are used to prevent dielectric breakdown.

Figure 5:
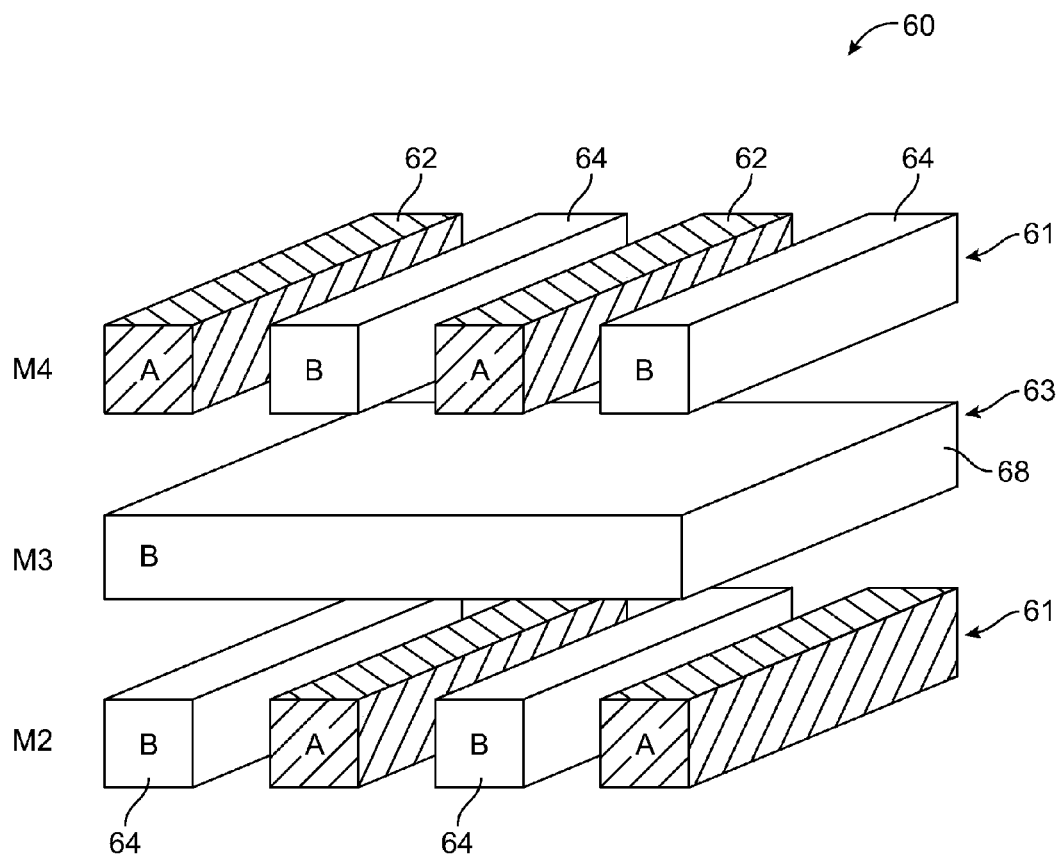
FIG. 5 is a perspective view of a line-plate-line capacitor formed from metal plates and parallel metal lines with the metal plates and parallel metal lines formed in alternating metal interconnect layers in accordance with an embodiment of the present invention.

A capacitor in accordance with an embodiment of the current invention is shown in FIG. 5. Line-plate-line capacitor 60 of FIG. 5 is formed across three metal interconnect layers M2, M3, and M4 as an example. If desired, line-plate-line capacitors such as capacitor 60 may be formed across other numbers of metal interconnect layers and may be located in different metal interconnect layers of dielectric stack 8 of FIG. 1.

As shown in FIG. 5, the M2 and M4 metal interconnect layers of capacitor 60 contain parallel metal lines 62 of polarity A and parallel metal lines 64 of polarity B. Metal lines 62 of each metal interconnect layer can be shorted together to form a comb-like capacitor terminal of polarity A and metal lines 64 of each metal interconnect layer can be shorted together to form a comb-like capacitor of polarity B. These comb-like capacitor terminals are interwoven in the M2 and M4 metal interconnect layers. Metal lines in the M2 metal interconnect may be offset from metal lines 62 and 64 in the M4 metal interconnect layer so that metal lines of one polarity in the M4 metal interconnect layer lie directly over metal lines of a different polarity in the M2 metal interconnect layer. Metal lines may also be arranged so that metal lines 62 and 64 in the M4 metal interconnect layer lie directly over metal lines of the same polarity in the M2 metal interconnect layer. A metal interconnect layer containing metal lines such as the M2 and M4 metal interconnect layers in FIG. 5 may be referred to as a metal-line layer 61.

A metal plate 68 may be formed in the M3 metal interconnect layer of line-plate-line capacitor 60. In capacitors 60 that are formed across more than three metal interconnect layers metal plates such as plate 68 of FIG. 5 may be formed in alternate metal interconnect layers each interposed between a respective pair of metal-line layers. Metal plate 68 is shown as being of polarity B, but may, if desired, be of polarity A. Moreover, plates may be of different polarities in different metal interconnect layers. A metal interconnect layer containing metal plate 68 such as the M3 metal interconnect layer in FIG. 5 may be referred to as a metal-plate layer 63.

Figure 6:
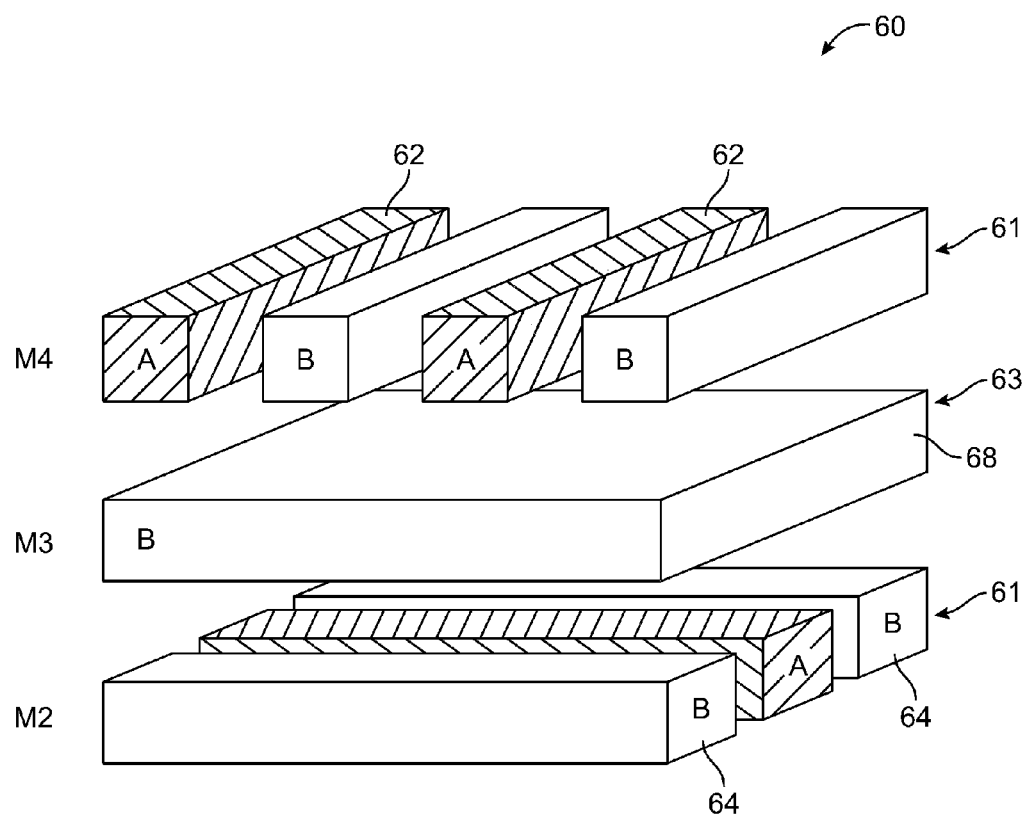
FIG. 6 is a perspective view of a capacitor formed from metal plates and parallel metal lines with the metal plates and parallel metal lines formed in alternating metal interconnect layers and with the parallel metal lines oriented in transverse directions in different metal interconnect layers in accordance with an embodiment of the present invention.

As shown in FIG. 6, parallel metal lines 62 and 64 of line-plate-line capacitor 60 may be oriented in one direction in the M2 metal interconnect layer and in an orthogonal (transverse) direction in the M4 metal interconnect layer. For line-plate-line capacitors 60 that are formed across more metal interconnect layers than are shown in FIG. 6, parallel metal lines 62 and 64 may alternate in orientation for each metal interconnect layer that contains parallel metal lines (if desired).

Figure 7:
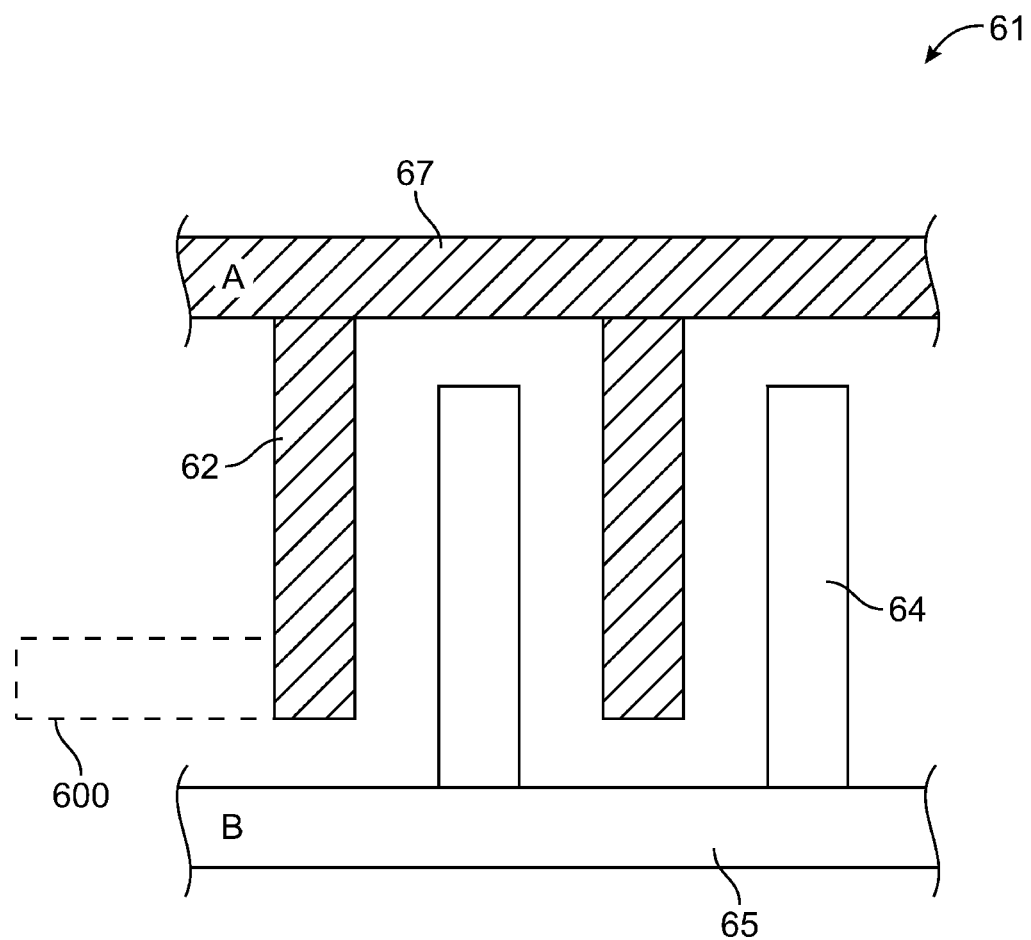
FIG. 7 is a diagram showing a metal interconnect layer containing parallel metal lines that are arranged in a comb-woven configuration in accordance with an embodiment of the present invention.

FIG. 7 shows a top view of metal-line layer 61 such as the M2 and M4 metal interconnect layers of line-plate-line capacitors 60 in FIGS. 5 and 6. Metal lines 62 of polarity A can be shorted together by a conductive path such as terminal 67 to form one comb-like structure and metal lines 64 of polarity B may be shorted together by a conductive path such as terminal 65 to form a second comb-like structure. The comb-like structures with polarities A and B may be interwoven so that parallel metal lines 62 and 64 alternate in polarity. Metal lines 62 and 64 need not be formed as straight lines. For example, metal lines 62 and 64 may be L-shaped to reduce parasitic inductive coupling as shown by dashed line 600.

Figure 8A:
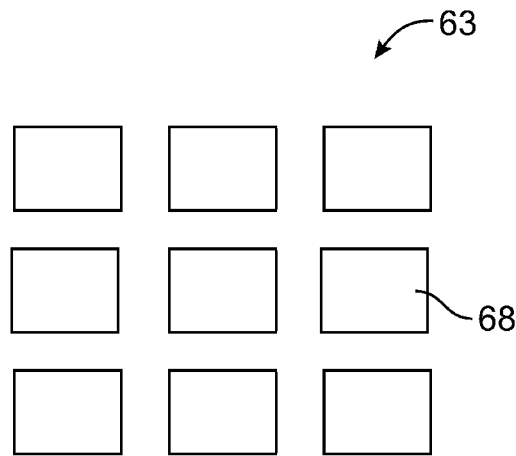
FIG. 8A is a top view of a metal interconnect layer containing multiple metal plates arranged in a grid in accordance with an embodiment of the present invention.

A metal-plate layer 63 may contain multiple metal plates 68 arranged in a grid-like pattern as shown in FIG. 8A. This type of approach may be used in situations where the size of a metal region is limited by fabrication parameters. For example, a metal region on an integrated circuit might have a maximum permissible size of 4.5 microns by 4.5 microns in order to avoid unwanted "dishing" effects that would cause a metal region to be thinner in the center than on the edges. FIG. 8A shows a grid of metal plates 68 of the same polarity. Metal plates 68 may be shorted together and to metal lines of the same polarity in metal-line layers 61 to form a single terminal for line-plate-line capacitor 60. Metal plates 68 may be square or rectangular or may have other suitable shapes.

Figure 8B:
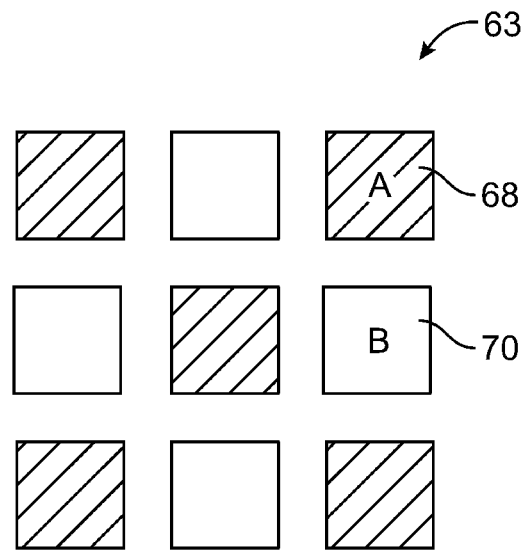
FIG. 8B is a top view of a metal interconnect layer containing metal plates of two polarities that are arranged in a checkerboard pattern in accordance with an embodiment of the present invention.

FIG. 8B shows a grid-like pattern of metal plates 68 of polarity A and metal plates 70 of polarity B. Metal plates 68 may be shorted together and to metal lines 62 in metal-line layers 61 to form one terminal of polarity A and metal plates 70 may be shorted together and to metal lines 64 in metal-line layers 61 to form another terminal of polarity B. Metal plates 68 and 70 in FIG. 8B are shown as alternating in a checkerboard pattern. A checkerboard pattern of metal plates with alternating polarities may help increase capacitance by creating a horizontal intralayer contribution to the capacitance across gaps between metal plates of opposite polarity.

Figure 9:
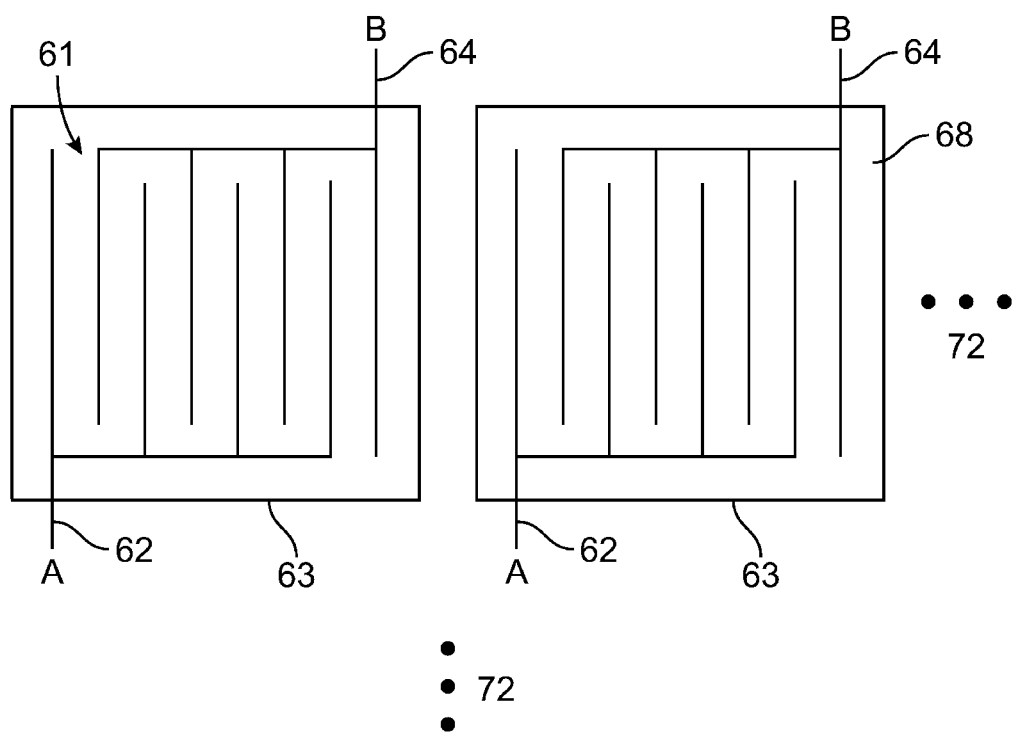
FIG. 9 is a diagram showing multiple metal plates that each have an accompanying cluster of comb-woven parallel metal lines in accordance with an embodiment of the present invention.

FIG. 9 shows how metal-line layer 61 may be arranged when metal-plate layer 63 is formed as a grid of metal plates 68. FIG. 9 shows metal lines 62 of polarity A that may be shorted together to form comb-like structures, and metal lines 64 of polarity B that may be shorted together to form comb-like structures. The comb-like structures may be interwoven and may be clustered over respective metal plates 68, such that each comb-like cluster is superimposed over a respective metal plate 68. This configuration may be repeated for as many plates 68 as desired, as indicated by the dots 72.

Figure 10:
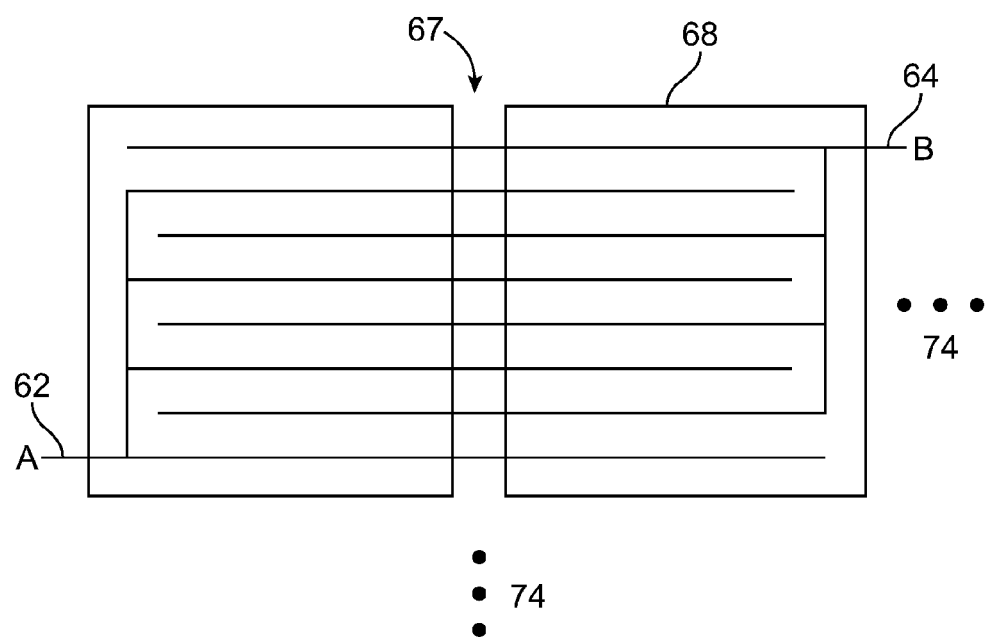
FIG. 10 is a diagram showing multiple metal plates with accompanying comb-woven parallel metal lines that extend across multiple metal plates in accordance with an embodiment of the present invention.

FIG. 10 shows another arrangement for metal-line layer 61 when a metal-plate layer 63 is formed as a grid of metal plates 68. FIG. 10 shows metal lines 62 of polarity A that may be shorted together to form comb-like structures, and metal lines 64 of polarity B that may be shorted together to form comb-like structures. The comb-like structures may be interwoven. Unlike the arrangement in FIG. 9, the comb-like structures of FIG. 10 span more than one metal plate 68 and cross over gap 67 between metal plates 68. As indicated by dots 74, this configuration may be extended over as many metal plates 68 as needed. A single cluster of interwoven comb-like structures may be superimposed over any number of metal plates 68.

The presence of metal plate 68 increases the vertical interlayer capacitance of capacitor 60 by interacting with fringe electric fields from metal lines 62. In effect, plate 68 removes any horizontal intralayer capacitance that a metal-line layer in the M3 metal interconnect layer would provide, and replaces it with additional vertical interlayer capacitance between the M3 metal interconnect layer and its adjacent metal interconnect layers M2 and M4. By emphasizing vertical interlayer capacitance, the line-plate-line capacitor 60 may take advantage of the elevated dielectric properties of caps 46 of FIG. 4 that are sometimes formed over the metal interconnect layers.

Metal plates 68 may also act as an electromagnetic shield, reducing the effects of undesired parasitic inductive coupling. This may help produce a stable capacitance for line-plate-line capacitor 60 at higher voltages and higher frequencies. Stable high-frequency operation and high voltage operation may be particularly beneficial in analog circuits.

For certain semiconductor technology nodes, such as for 32 nm and smaller, and for certain values of interline spacing s of FIG. 4, the increased vertical interlayer capacitance of line-plate-line capacitor 60 can result in a greater capacitance per unit area than metal-comb-woven capacitor 40 of FIGS. 3 and 4. In particular, line-space-line capacitor 60 may have greater capacitance per unit area than the metal-comb-woven capacitor 40 for a 32 nm semiconductor technology node when parameters such as interlayer distance d of 70 nm, line-width w between 45 nm and 80 nm, and dielectric material with a dielectric constant $\in$ of 2.43 $\in_0$ ($\in_0$ is the dielectric constant of vacuum), and line-spacing s greater than 65 nm. Larger benefits are expected for more advanced technology nodes that utilize even smaller sizes, such as a 22 nm technology node.

Larger benefits are also expected when dielectric materials with lower dielectric constants are used. For example, in analog circuits such as transceiver circuits that may use elevated voltages, an increased line-spacing s (see, e.g., FIG. 4) may be needed in order to prevent dielectric breakdown from occurring between metal lines when dielectric material with a low dielectric constant is used. It may, for example, be desirable to form capacitors with line spacings s that are larger than the minimum spacing permitted by semiconductor fabrication design rules. With increased values of line-spacing s, the horizontal intralayer capacitance decreases for metal-line-woven capacitor 40 of FIGS. 3 and 4, resulting in additional advantages in using line-plate-line capacitor 60 which emphasizes vertical interlayer capacitance.

Figure 11:
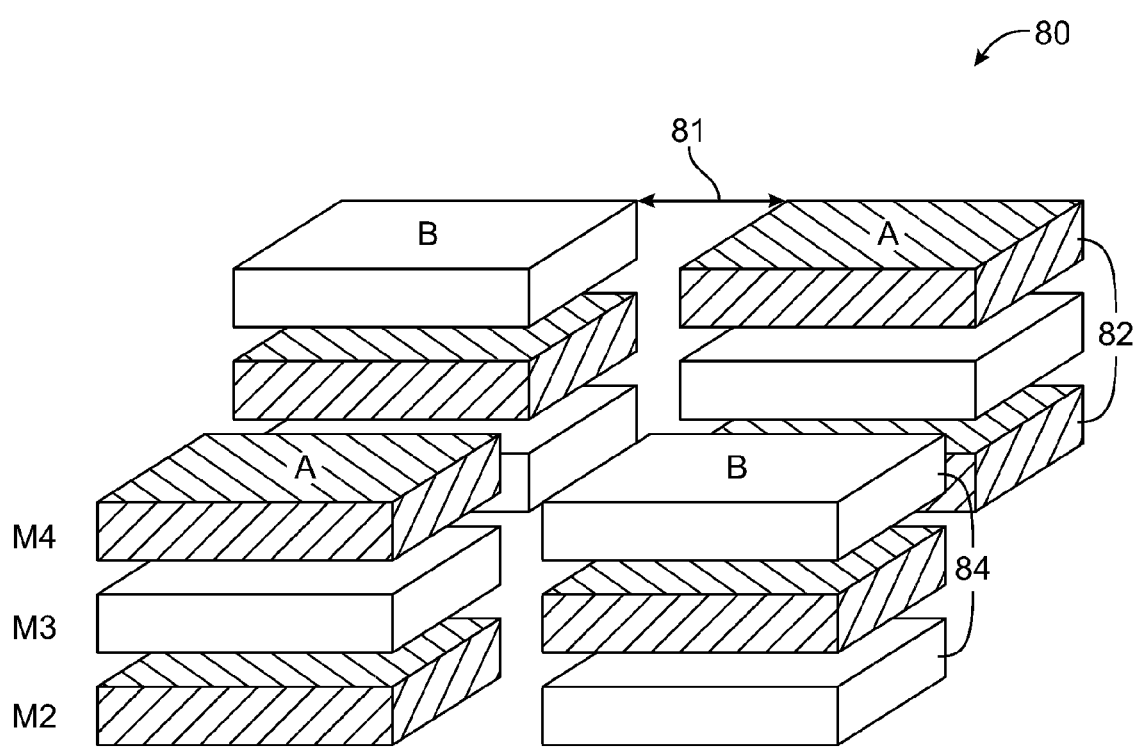
FIG. 11 is a perspective view of a segmented-plate capacitor formed from multiple metal plates of two polarities that are arranged in order of alternating polarity in accordance with an embodiment of the present invention.

In some integrated circuits, especially those operating at elevated voltages that require even larger values for line-spacing s, it may be advantageous to use a capacitor design that has an even greater emphasis on vertical interlayer capacitance versus horizontal intralayer capacitance. Segmented-plate capacitor 80 in FIG. 11 contains metal plates 82 with polarity A and metal plates 84 with polarity B that may be arranged with alternating polarity both within and between metal interconnect layers. Metal plates 82 may be shorted together to form one terminal of segmented-plate capacitor 80 and metal plates 84 may be shorted together to form a second terminal of segmented-plate capacitor 80. Segmented-plate capacitor 80 is shown in FIG. 11 as being formed in metal interconnect layers M2, M3, and M4, although segmented-plate capacitor 80 may be formed of any number of metal interconnect layers and be located in other metal interconnect layers of dielectric stack 8 of FIG. 1.

The size of metal plates 82 and 84 may be limited by fabrication parameters. For example, metal plates 82 and 84 may need to be less than 4.5 microns in their longest direction in order to avoid "dishing" effects that would lead to plates that are thinner in the middle than at the edges.

Using metal plates 82 and 84 may avoid the use of parallel lines, thereby reducing the effects of undesired parasitic inductive coupling. This may result in stable capacitance for segmented-plate capacitor 60 at higher voltages and higher frequencies.

Figure 12:
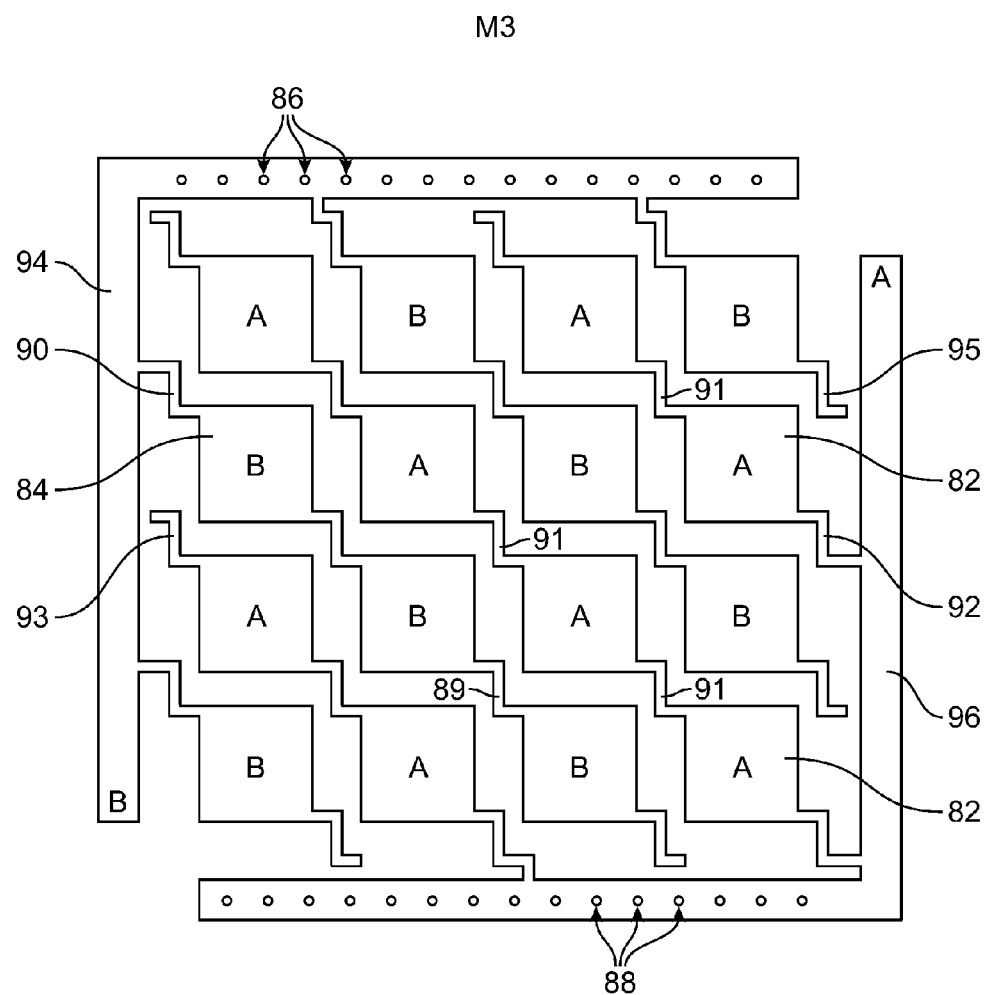
FIG. 12 is a top view of one metal-interconnect layer of a segmented-plate capacitor in which metal plates of the same polarity are shorted together in accordance with an embodiment of the present invention.

FIG. 12 shows an illustrative configuration for a metal-interconnect layer in segmented-plate capacitor 80. In FIG. 12, metal plates 82 of polarity A and metal plates 84 of polarity B are arranged in a checkerboard pattern. Metal plates 82 of polarity A may be shorted together by linking paths 91 and may be shorted by path 92 to a conductive path such as path 96 of polarity A. Vias 88 may connect path 96 of polarity A to a similar path of polarity A that is located in an adjacent metal interconnect layer thereby forming a capacitor terminal of polarity A. Metal plates 84 of polarity B may be connected together by path 89 and may be connected by path 90 to a conductive path such as to path 94 of polarity B. Vias 86 may connect path 96 of polarity B to a similar path of polarity B in an adjacent metal interconnect layer, thereby forming a capacitor terminal of polarity B. Metal plates 82 may have unterminated conductive structures such as unterminated path 93 and metal plates 84 may contain unterminated conductive structures such as unterminated path 95. Structures 93 and 95 may help to increase capacitance by reducing the size of gaps between metal plates of opposite polarities. The illustrative structures of FIG. 12 have been formed in the M2 metal interconnect layer, but can be used for other metal interconnect layers.

Figure 13:
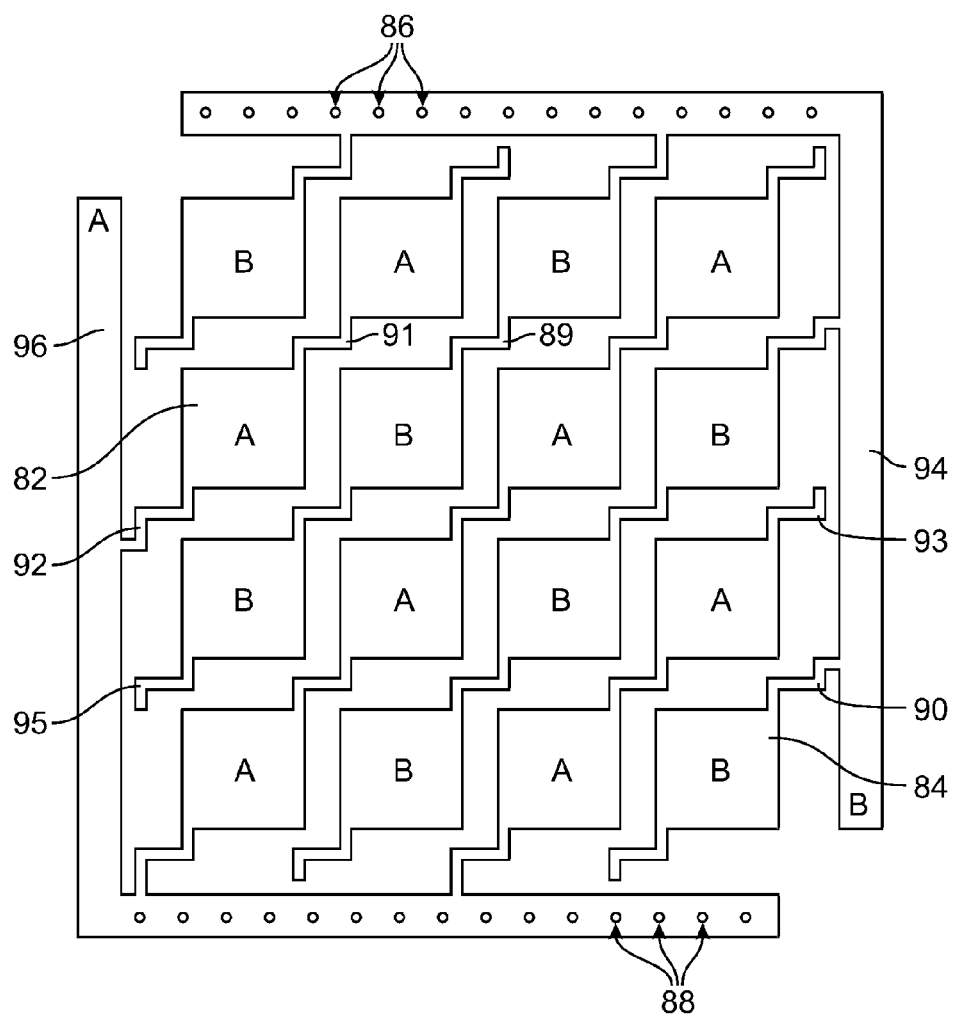
FIG. 13 is a top view of another (adjacent) metal-interconnect layer of a segmented-plate capacitor in which metal plates of the same polarity are shorted together in accordance with an embodiment of the present invention.

FIG. 13 is a diagram showing how metal plates may be shorted together within a metal interconnect layer that is adjacent to the metal interconnect layer in FIG. 12. In FIG. 13, metal plates 82 of polarity A and metal plates 84 of polarity B are arranged in a checkerboard pattern opposite to the checkerboard pattern of the adjacent layer of FIG. 12. Metal plates 82 of polarity A may be shorted together by paths 91 and may be shorted by path 92 to a conductive path such as path 96 of polarity A. Vias 88 may connect path 96 of polarity A to a similar path of polarity A that is located in an adjacent metal interconnect layer. Metal plates 84 of polarity B may be connected together by paths 89 and may be connected by paths 90 to a conductive path such as to paths 94 of polarity B. Vias 86 may connect paths 96 of polarity B to a similar paths of polarity B in an adjacent metal interconnect layer. As with the unterminated paths of FIG. 12, unterminated paths 93 and 95 may help to increase capacitance by reducing the size of gaps between metal plates of opposite polarities.

The FIG. 13 checkerboard pattern is offset from the checkerboard pattern of FIG. 12, so that when the FIG. 12 and FIG. 13 patterns are used for adjacent metal interconnect layers, metal plates 82 and 84 will alternate in polarity in the vertical (interlayer) direction. The FIG. 12 configuration may be used for "even" metal interconnect layers and the FIG. 14 configuration for "odd" metal interconnect layers, or vice versa. Any suitable number of layers may be stacked in this way to form a larger capacitor.

Figure 14:
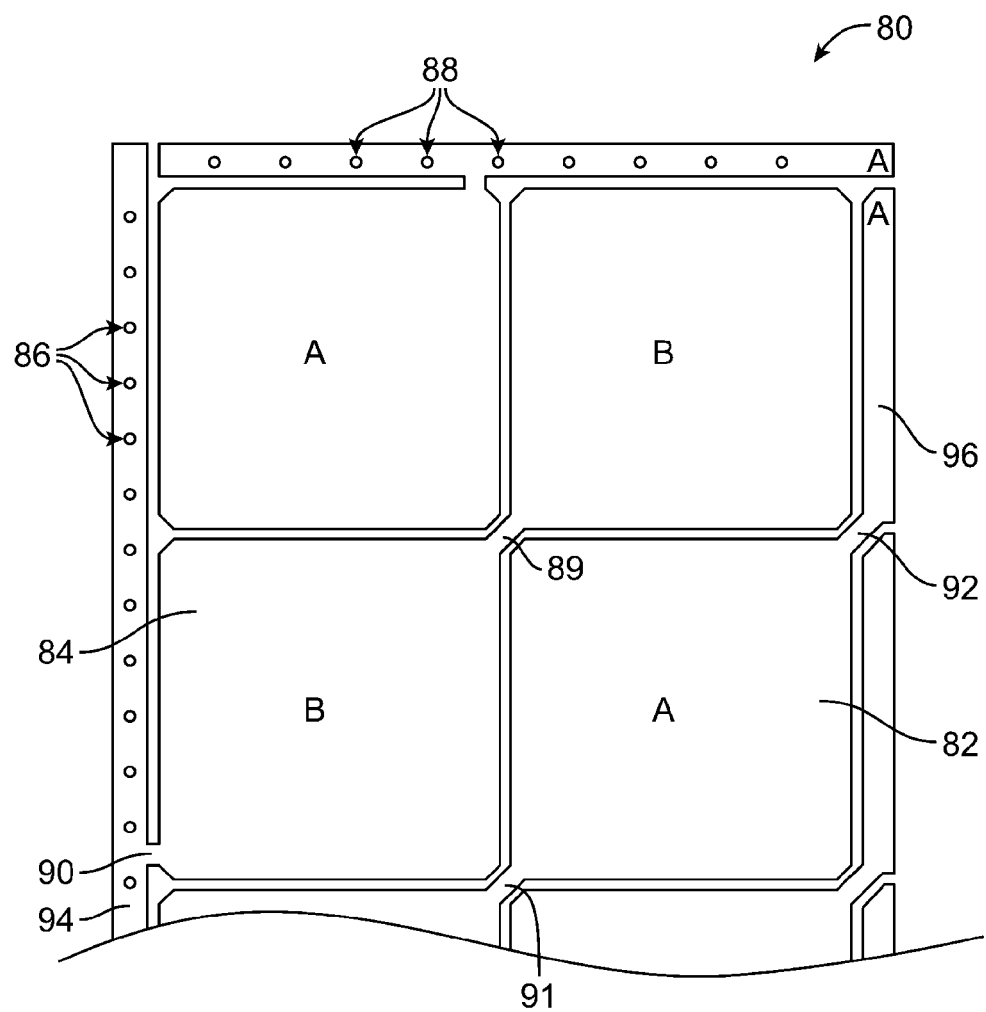
FIG. 14 is a top view of a metal-interconnect layer of a segmented-plate capacitor in which the metal plates are squares with angled corners in accordance with an embodiment of the present invention.

Metal plates 82 and 84 in FIGS. 12 and 13 need not be rectangular in shape. FIG. 14 shows another possible configuration for a metal interconnect layer of segmented-plate capacitor 80. In FIG. 14, metal plates 82 of polarity A and metal plates 84 of polarity B are arranged in a checkerboard pattern. Metal plates 82 and 84 have corners that are cut off so that the metal plates 82 and 84 have a square shape with angled corners (i.e. corner sides at 45 degree angles relative to the top and bottom sides of the squares), resulting in an eight-sided (octagonal) geometry. If desired, metal plates 82 and 84 may each have eight equal sides (i.e. metal plates 82 and 84 may be octagons). In a geometry in which metal plates 82 and 84 are octagons (or nearly octagons), paths such as paths 89, 91, and 92 can run parallel to opposing diagonal sides of the octagons of opposing polarity. The use of octagons for the plates in a capacitor may be helpful in maximizing capacitance per unit area, because the overhead associated with forming paths 89, 91, and 92 can be minimized relative to arrangements of the type shown in FIGS. 12 and 13 in which the interconnecting paths have orthogonal sides that require the inclusion of extra spaces between adjacent plates.

Other shapes may also be used for plates 82 and 84 such as plates with three sides, four sides, five sides, six sides, seven sides, eighth or more sides, etc. The sides in these shapes may be equal in length (e.g., as in equilateral triangles, squares, octagons, etc.) or may be unequal in length (e.g., in the case of rectangles with heights that are not equal to their widths, in the case of octagons with different side lengths, etc.). The example of FIG. 14 in which plates 82 and 84 have square shapes with cut-off sides (i.e., roughly octagonal shapes) is merely illustrative.

As shown in FIG. 14, metal plates 82 of polarity A may be shorted together by paths 91 and may be shorted by paths 92 to a conductive path such as paths 96 of polarity A. Vias 88 may connect paths 96 of polarity A to a similar path of polarity A that is located in an adjacent metal interconnect layer. Metal plates 84 of polarity B may be connected together by paths 89 and may be connected by path 90 to a conductive path such as to paths 94 of polarity B. Vias 86 may connect path 96 of polarity B to a similar path of polarity B in an adjacent metal interconnect layer. The angled-corner shape of metal plates 82 and 84 in FIG. 14 enables metal plates 82 and 84 to be positioned closer together than in the configurations of FIGS. 12 and 13, while accommodating diagonal shorting paths. As a result, paths 89 that connect metal plates 84 and paths 92 that connect metal plates 82 may be simple straight diagonal segments that may be short in length relative to the metal plates. The illustrative shorting paths in FIGS. 12 and 13 tend to be longer in length and have multiple angles. Configurations other than the ones shown in FIGS. 12-14 or combinations of such arrangements may also be used for segmented-plate capacitor 80 if desired.

The metal plate configurations shown in FIGS. 12 and 13 and the metal plate configuration shown in FIG. 14 may also be used for the metal plate layer 63 of line-plate-line-capacitor 60 of FIGS. 5 and 6.

The capacitance of segmented-plate capacitor 80 may have a greater contribution from a vertical interlayer capacitance than that of line-plate-line capacitor 50 in FIGS. 5 and 6. The horizontal intralayer capacitance in segmented-plate capacitor 80 arises from gaps between metal plates of opposite polarity in a common metal interconnect layer, as denoted by arrow 81 of FIG. 11. The horizontal intralayer capacitance of a metal interconnect layer containing segmented plates separated by a given spacing is generally less than it would be for a metal interconnect layer containing an equal area of metal lines separated by the same spacing. Nevertheless, the parallel metal plates in a segmented design help maximize vertical interlayer capacitance. Segmented-plate capacitor 80 may therefore take advantage of the greater effective dielectric constant in the vertical interlayer direction as provided by the inherent dielectric properties of caps 46.

For certain semiconductor technology nodes, such as for 32 nm and smaller, the increased vertical interlayer capacitance of segmented-plate capacitor 80 can result in a greater capacitance per area than metal-comb-woven capacitor 40 in FIGS. 3 and 4 or line-plate line capacitor 60 in FIGS. 5 and 6. In particular, for a 32 nm semiconductor technology node, segmented-metal capacitors may have greater capacitance per unit area (volume) than the metal-comb-woven capacitor 40 in FIG. 4, when parameters are used such as an interlayer distance d of 70 nm, a line-width w of 75 nm, and a line-spacing s of 75 nm. A segmented-metal plate capacitor with plates of dimensions 0.7 micron×0.7 micron having angled corners may have a capacitance per area of 1.24 fF per square micron.

Larger benefits are expected for more advanced technology nodes that utilize even smaller sizes, such as a 22 nm technology node. Larger benefits are also expected when larger values interline spacing s (see, e.g. FIG. 4) are needed to avoid dielectric breakdown effects. Larger interline spacing tends to decrease the advantages of having a capacitor design that emphasizes horizontal intralayer capacitance. Larger interline spacing values s such as spacings s larger than the minimum permitted by semiconductor fabrication design rules may be desirable in cases where an elevated voltage is used to prevent breakdown from occurring between metal lines (e.g., in previous dielectrics or other low dielectric constant materials).

Metal-insulator-metal capacitors such as line-plate-line capacitor 60 and segmented-plate capacitor 80 may be used in any suitable types of integrated circuits such as microprocessors, digital signal processors, or application specific integrated circuits. The integrated circuits may also be programmable integrated circuits. Examples of programmable integrated circuits include programmable logic devices (also sometimes referred to as field-programmable gate arrays) and integrated circuits that have programmable circuitry, but which are not typically referred to as programmable logic devices, such as microprocessors, digital signal processors, or application specific integrated circuits that contain programmable circuitry.

Figure 15:
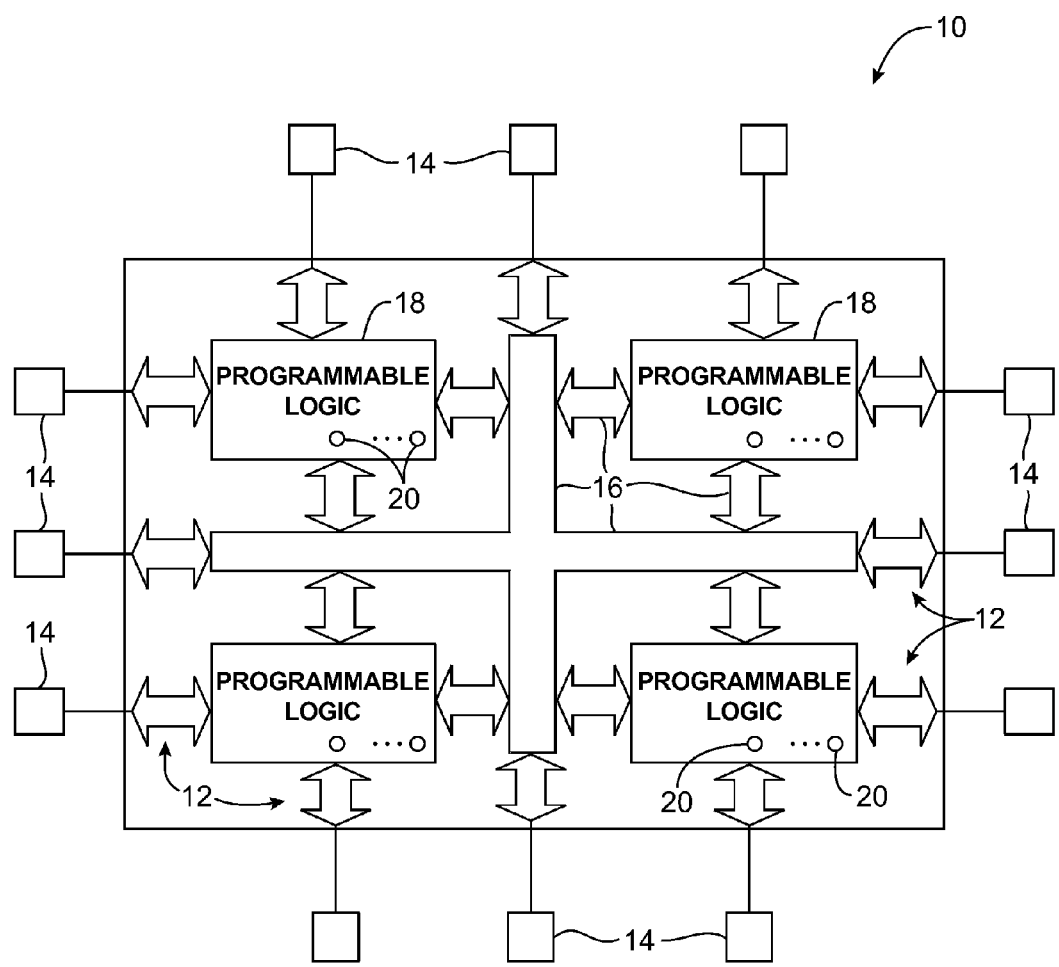
FIG. 15 is a diagram of an illustrative integrated circuit that may incorporate capacitors in accordance with an embodiment of the present invention.

An illustrative programmable logic device 10 that may be provided with metal-insulator-metal capacitors such as line-plate-line capacitor 60 and segmented-plate capacitor 80 is shown in FIG. 15. Programmable logic device 10 has input-output circuitry 12 for driving signals off of device 10 and for receiving signals from other devices via input-output pins 14. Interconnection resources 16 such as global and local vertical and horizontal conductive lines and buses are used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources 16 may be considered to be a part of programmable logic 10.

Programmable logic device 10 contains programmable elements 20 such as random-access memory cells and nonvolatile elements such as polysilicon fuses. Programmable elements 20 (e.g., volatile elements such as random-access memory cells) can be loaded with configuration data (also called programming data) using pins 14 and input-output circuitry 12. The programmable elements each provide a corresponding static control output signal that controls the state of an associated logic component in programmable logic 18. The programmable element output signals are typically used to control the gates of metal-oxide-semiconductor (MOS) transistors. Most of these transistors are generally n-channel metal-oxide-semiconductor (NMOS) pass transistors in programmable components such as multiplexers, look-up tables, logic arrays, AND, OR, NAND, and NOR logic gates, etc. When a programmable element output is high, the pass transistor controlled by that programmable element is turned on and passes logic signals from its input to its output. When the programmable element output is low, the pass transistor is turned off and does not pass logic signals.

The programmable elements may be loaded from any suitable source. In a typical arrangement, the programmable elements are loaded from an external erasable-programmable read-only memory and control chip called a configuration device via pins 14 and input-output circuitry 12. Nonvolatile elements may be electrically programmed during manufacturing using programming equipment or on-chip circuits (as examples).

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

The foregoing is merely illustrative of the principles of this invention and various modifications can be made by those skilled in the art without departing from the scope and spirit of the invention.

What is claimed is:

1. A capacitor formed in a dielectric stack in an integrated circuit, the capacitor comprising:
   metal lines that have a first polarity and metal lines that have a second polarity, wherein the metal lines are arranged in order of alternating polarity and wherein the metal lines are formed in a first interconnect layer in the dielectric stack in the integrated circuit; and
   a plurality of metal plates formed in a second metal interconnect layer in the dielectric stack in the integrated circuit, wherein at least one of the metal plates has the first polarity, wherein the at least one metal plate has a continuous planar geometry that extends past the metal lines of the first polarity and the metal lines of the second polarity, wherein the at least one metal plate has an outline, and wherein the metal lines of the first polarity and the metal lines of the second polarity overlap the at least one metal plate and lie substantially within the outline.

2. The capacitor defined in claim 1, wherein the metal lines comprise parallel metal lines, and wherein the metal lines of the first polarity and the at least one metal plate of the first polarity are shorted together to form a first terminal of the capacitor and the metal lines of the second polarity are shorted together to form a second terminal of the capacitor.

3. The capacitor defined in claim 1 wherein the first metal interconnect layer and the second metal interconnect layer are adjacent metal interconnect layers in the dielectric stack.

4. The capacitor defined in claim 1 wherein the plurality of metal plates comprise a plurality of metal plates that have the first polarity and that are electrically coupled to the metal lines of the first polarity.

5. The capacitor defined in claim 1 wherein the plurality of metal plates comprise:
   a first set of metal plates that have the first polarity; and
   a second set of metal plates that have the second polarity.

6. The capacitor defined in claim 5 wherein the first set of metal plates and the second set of metal plates are arranged in alternating order in the second metal interconnect layer.

7. The capacitor defined in claim 1 wherein each of the plurality of metal plates comprises a rectangular metal plate with cut-off angled corners.

8. A capacitor formed in a dielectric stack in an integrated circuit, the capacitor comprising:
   a first set of metal plates that have a first polarity and form a first terminal of the capacitor; and
   a second set of metal plates that have a second polarity, and form a second terminal of the capacitor, wherein at least some of the first set of metal plates and at least some of the second set of metal plates are formed in a first metal interconnect layer in the dielectric stack of the integrated circuit, wherein at least others of the first set of metal plates and at least others of the second set metal plates are formed in a second metal interconnect layer in the dielectric stack of the integrated circuit, wherein the metal plates each have cut-off angled corners and are arranged in a checkerboard polarity pattern, and have associated diagonal shorting paths that connect cut-off angled corners of plates of common polarity, wherein the second metal interconnect layer and the first metal interconnect layer are adjacent metal interconnect layers, wherein the metal plates in the first set of metal plates in the first metal interconnect layer are vertically under the metal plates in the second set of metal plates in the second metal interconnect layer, and wherein the metal plates in the second set of metal plates in the first metal interconnect layer are vertically under the metal plates in the first set of metal plates in the second metal interconnect layer.

9. The capacitor defined in claim 8 wherein the metal plates in the given metal interconnect layer each have a rectangular geometry.

10. The capacitor defined in claim 8 wherein the first set of metal plates in the first metal interconnect layer is shorted to the first set of metal plates in the second metal interconnect layer and forms a first of a pair of terminals for the capacitor, and wherein the second set of metal plates in the first metal interconnect layer is shorted to the second set of metal plates in the second metal interconnect layer and forms a second of the pair of terminals for the capacitor.

11. A capacitor formed in a dielectric stack of an integrated circuit, the capacitor comprising:
   a first set of metal lines and a second set of metal lines;
   a first metal interconnect layer in the dielectric stack of the integrated circuit, wherein at least some of the first set of metal lines and at least some of the second set of metal lines are formed in the first metal interconnect layer;
   a second metal interconnect layer in the dielectric stack of the integrated circuit, wherein at least some of the first set of metal lines and at least some of the second set of metal lines are formed in the second metal interconnect layer;
   a third interconnect layer in the dielectric stack of the integrated circuit interposed between the first and second metal interconnect layers; and
   at least one metal plate formed in the third interconnect layer, wherein the metal lines in the first set of metal lines are electrically connected together and are electrically connected to the at least one metal plate to form a first terminal of the capacitor and wherein the metal lines of the second set of metal lines are electrically connected together to form a second terminal of the capacitor, wherein the at least one metal plate has a solid planar geometry that extends across the metal lines in the first and second set of metal lines, wherein the capacitor comprises:
      an additional metal plate formed in the third interconnect layer, wherein the first and second sets of metal lines in the first and second interconnect layers extend across both metal plates and wherein the metal lines in the first set of metal lines alternate with the metal lines in the second set of metal lines.

12. The capacitor defined in claim 11 wherein the first and second sets of metal lines comprise metal lines containing right angles.

\* \* \* \* \*